United States Patent [19]
Werrbach

[11] Patent Number: 5,463,695
[45] Date of Patent: Oct. 31, 1995

[54] PEAK ACCELERATED COMPRESSOR

[75] Inventor: Donn Werrbach, Glendale, Calif.

[73] Assignee: Aphex Systems, Ltd., Sun Valley, Calif.

[21] Appl. No.: 262,539

[22] Filed: Jun. 20, 1994

[51] Int. Cl.$^6$ ................................................ H03G 7/00
[52] U.S. Cl. ............................................ 381/106; 333/14
[58] Field of Search ................................ 381/104, 106, 381/107, 98; 333/14

[56] References Cited

U.S. PATENT DOCUMENTS

| | | | |
|---|---|---|---|
| 4,281,295 | 7/1981 | Nishimura | 333/14 |
| 4,630,302 | 12/1986 | Kryter | 381/106 |

FOREIGN PATENT DOCUMENTS

| | | | |
|---|---|---|---|
| 3728327 | 3/1988 | Germany | 381/106 |

Primary Examiner—Scott A. Rogers
Assistant Examiner—Jerome Grant, II
Attorney, Agent, or Firm—Thomas I. Rozsa; Tony D. Chen

[57] ABSTRACT

A peak accelerated compressor comprising a voltage controlled amplifier, a level detector and a peak accelerated filter circuit. The voltage controlled amplifier circuit is utilized for processing an input audio signal and producing an output audio signal. The level detector circuit is utilized for processing a sample audio signal which contains transient peaks and average waveforms. The peak accelerated filter circuit is coupled between the level detector circuit and the voltage controlled amplifier circuit for producing a control output signal to change the gain of the voltage controlled amplifier circuit in response to the transient peaks in the sample audio signal. The peak accelerated compressor effectively enhances the compression for transient peaks without adversely affecting the normal compression of average waveforms.

62 Claims, 6 Drawing Sheets

PEAK ACCELERATED COMPRESSOR

BACKGROUND OF THE INVENTION

1. Field of The Invention

The present invention relates to the field of audio signal processing technologies. More particularly, the present invention relates to the field of audio compression technologies.

2. Description of The Prior Art

Audio signals are complex waveforms which often contain transients of brief duration and relatively high amplitude. These transients are natural to sound, and cannot easily be avoided. Taking transients into account, the dynamic range of an audio signal can be wider than is practical for electronic recording, transmission, and reproduction. To avoid overload, noise, and distortion problems arising from excessive audio dynamics, it is well established in the prior art that automatic devices such as compressors and limiters are frequently used to control the peak and average values of an audio waveform.

Audio compressors fall into two classes which are referred to as feedforward or feedback compressors. Referring to FIGS. 1a and 1b for illustration of the two types, there are shown the basic block diagrams of a feedforward and feedback compressor, respectively. The only difference between a feedforward and feedback compressor is the point where the level detector samples the audio signal. The operation of the compressors of FIGS. 1a and 1b should be obvious enough not to require a detailed description. However, a brief explanation will be offered.

Referring to FIG. 1a which depicts the feedforward compressor, a voltage controlled amplifier (VCA) 2 is connected between an input signal path 1, an output signal path 3, and a gain control signal path 7. The level detector 4 for converting an audio signal into a detected signal suitable to control the gain of the VCA 2 has its input coupled to the input signal path 1 of VCA 2. The output signal of the level detector 4 is coupled to the gain control signal path 7 of the VCA 2. When an audio input signal large enough to exceed the compression threshold established by the level detector 4 appears at the input signal path 1, a detected output signal appears at the VCA gain control signal path 7 reducing the gain of VCA 2 in some proportion to the relative level of the audio input signal. This proportion determines the compression ratio which is expressed as the change of the audio level at the input signal path 1 divided by the resulting change of the audio level at the output signal path 3.

Referring to FIG. 1b which depicts the feedback compressor, one can apply nearly the same explanation as previously given for FIG. 1a. The only difference is that the level detector 4 has its input coupled to the output signal path 3 of VCA 2. In this case, the feedback compressor operates similarly to the feedforward compressor of FIG. 1a except that the effect of gain control feedback creates a servoing mechanism which increases the dynamic stability over that of a feedforward compressor, especially at high compression ratios.

Unfortunately, use of the automatic devices such as the audio compressors can create various unwanted side effects in terms of the sound quality. Deleterious side effects can be severe when the audio peaks, especially transients, are automatically reduced in amplitude by gain reduction. This is because a reduction of gain occurring quickly enough to effectively limit the peak amplitude usually brings about a consequential sudden reduction of the average waveform amplitude for a period of time following the conclusion of the transient peak. This undesired effect is sometimes referred to as "hole punching" since the perception is like a hole punched in the sound level.

In addition, an audio compressor usually has a relatively low compression ratio of about 1.5:1 to about 3:1, and uses a level detector which responds :more to the average value of the sound level. This accomplishes a useful purpose by reducing the average dynamic range of an audio signal while maintaining good sound quality but cannot adequately control the presence of excessively high transient peaks because the compression ratio is too low. In fact, an audio compressor can exaggerate the presence of transient peaks by raising the average level of low level sounds containing transients.

It is therefore desirable to find a new solution for managing the peaks of an audio signal, especially the transients, which can be applied to both feedforward and feedback compressor types.

SUMMARY OF THE INVENTION

The present invention is a peak accelerated compressor. The primary object of the present invention is to provide an audio compression device which increases the compression ratio only for transient peaks of the audio to thereby more effectively control the excessive transient peak levels without adversely affecting the normal compression of average levels. Another object of the present invention is to provide a new device which can be added to a more conventional audio compressor circuit to convert it into a peak accelerated compressor.

The present invention uses a new approach to peak amplitude control by increasing the effective compression ratio of an audio compressor during transient peaks of an audio waveform. The present invention incorporates a means to increase the compression ratio of an audio compressor only during transient peak occurrences, thus allowing the compressor to retain its nominal average level controlling characteristics, but also to more effectively reduce sudden peak amplitudes without affecting the sound quality to a great degree.

The present invention differentiates between the more gradual and more sudden rates of change of the level detector output signal, and increases the level detector output voltage according to the rate of change such that faster rates cause a higher output voltage. The said higher output voltage of the level detector, when returned to the VCA element of the compressor, evokes a greater degree of gain reduction and thereby creates a higher compression ratio for the faster changing control signals.

The present invention can be adapted to either multiband compressors or single band compressors with equal validity. Even in applications such as telephony, where transient peaks are normally nonexistent in the audio signal itself, compressor overshoot caused by a sudden signal input can be considered as a transient peak, and the present invention can greatly aid in controlling the excessive output amplitude of the overshoot.

The present invention includes a means to extract from the control signal generated by a level detector the faster rates of change which represent the detection of a transient peak in the audio signal. The present invention further includes a means to amplify with greater magnitude only those faster changing parts of the level detector output signal. When applied to either a feedback or feed forward compression circuit, the present invention increases the compression ratio only for the compression of transient peaks, thus creating a peak accelerated compressor.

Described in detail, the present invention is a peak accelerated compressor comprising a voltage controlled amplifier circuit, a level detector circuit, and a peak accelerated filter circuit. The voltage controlled amplifier circuit is coupled between an input signal path and an output signal path for receiving an input audio signal and producing an output audio signal. The level detector circuit is coupled to a sample signal path for receiving a sample audio signal which contains transient peaks and average waveforms. The level detector circuit produces a detector output signal which is fast changing in response to the transient peaks in the sample audio signal, but slow changing in response to the average waveforms in the sample audio signal.

The peak accelerated filter circuit of the present invention peak accelerated compressor is coupled between the level detector circuit and the voltage controlled amplifier circuit for receiving the detector output signal. It includes an operational amplifier and a resistor-capacitor network, and produces a control output signal to reduce the gain of the voltage controlled amplifier circuit when the detector output signal is fast changing in response to the transient peaks in the sample audio signal, but maintain the gain of the voltage controlled amplifier circuit when the detector output signal is slow changing in response to the average waveforms in the sample audio signal.

Therefore, the peak accelerated filter circuit causes a greater relative gain reduction in the voltage controlled amplifier circuit for the transient peaks but a less relative gain reduction for the average waveforms. Accordingly, the present invention peak accelerated compressor effectively enhances the compression for transient peaks without adversely affecting the normal compression of average waveforms.

Described generally, the present invention is a peak accelerated compressor comprising a voltage controlled amplifier (VCA) connected between an input and an output signal path, a level detector connected to either the input signal path or the output signal path of the VCA for detecting an audio signal and producing a detected signal, a peak accelerated filter to receive the detected signal and add peak accelerated gain, and output connection from the peak accelerated filter to the VCA gain control input.

Described even more generally, the present invention is a peak accelerated compressor comprising a feedforward or feedback compressor circuit and a means to identify the faster changing components of the level detector output signal and increase the compression ratio only for those faster changing detector output signal components.

The present invention is inexpensive and can be easily added to many existing compressor circuits to enhance their peak controlling capability without affecting their desirable average compression characteristics. The benefit of this adaptation is better transient peak control without adversely affecting the normal operation of the compressor. A normal compressor so adapted to the present invention can be called a peak accelerated compressor.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 2A:
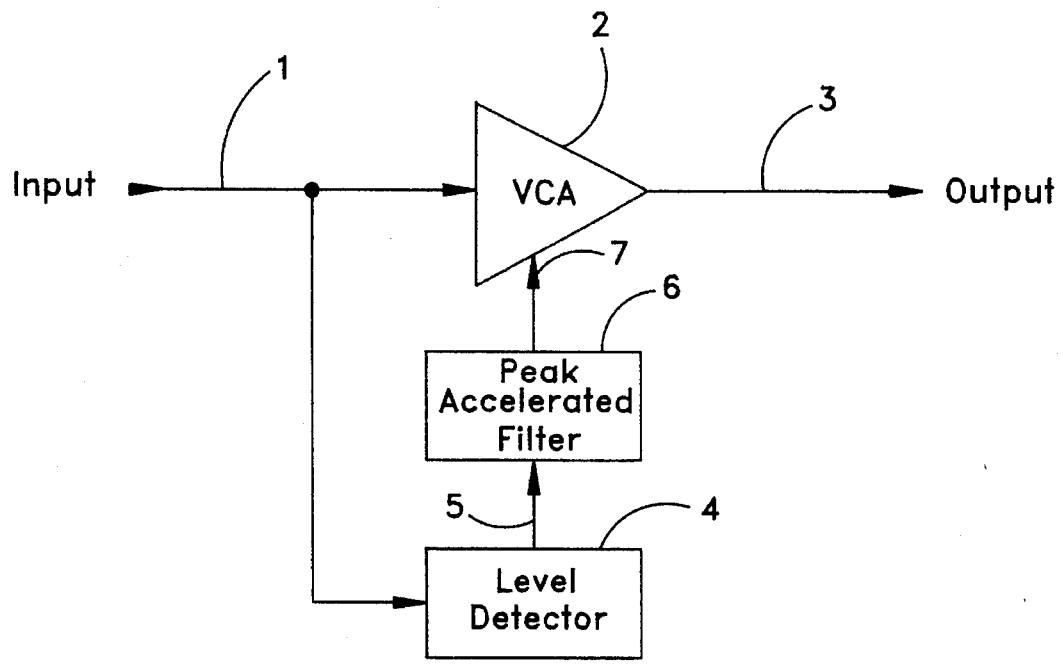
FIG. 2a is a block diagram of the present invention peak accelerated compressor configured as a feedforward compressor.
Figure 2B:
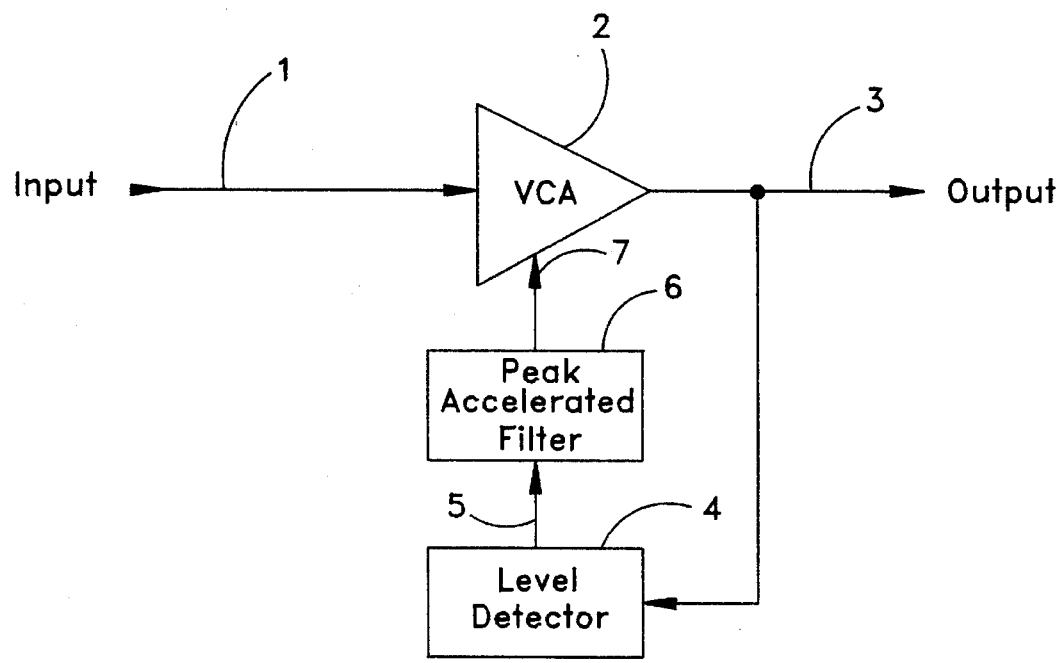
FIG. 2b is a block diagram of the present invention peak accelerated compressor configured as a feedback compressor.

Referring to FIGS. 2a and 2b, there are shown the block diagrams of the present invention peak accelerated compressor configured as feedforward and feedback compressors, respectively. It is within the contemplation, spirit and scope of the present invention to incorporate either a feedforward or feedback compressor scheme, and that the teachings of the present invention apply equally to both types. It is recognized that feedforward and feedback compressors pose somewhat different specific design problems to the practitioner, but this in no way limits the validity or the scope of the present invention.

As evidenced in FIGS. 2a and 2b, the present invention peak accelerated compressor comprises a voltage controlled amplifier (VCA) 2 connected between an input signal path 1 and an output signal path 3, a level detector 4, a peak accelerated filter 6, and a control feedback path 7 which is connected to the control input of VCA 2. The novel feature of the present invention is focused on the peak accelerated filter 6, and the specific details of how the level detector 4, the peak accelerated filter 6, and the VCA 2 combine to create the desired compressor action. Insofar as the present invention is concerned, the operation of the like referenced elements of FIG. 2a and 2b are identical and the FIGS. 2a and 2b can be interchanged throughout the following description except where exceptions are specifically stated.

It is noted that the teachings of the present invention can be practiced with many different sets of component values. In addition, in the following description, reference to any specific time constant will be referenced only by the reference designation in the manner of R1C1, for example. Similarly, reference to any branch of a circuit will be given in the manner of R1+C1+L1, for example.

Figure 3:
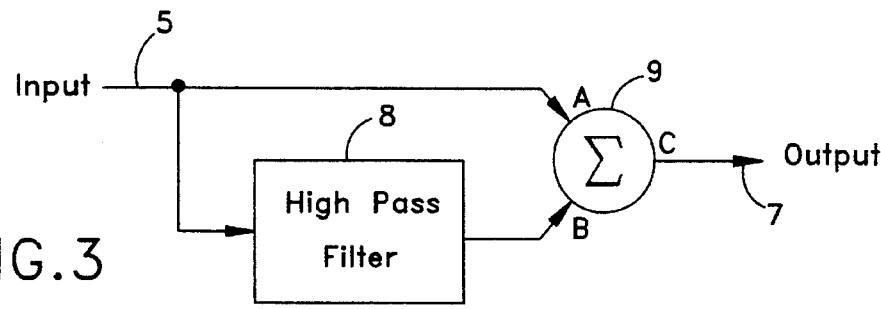
FIG. 3 is a block diagram of the accelerated filter of the present invention.

Referring to FIG. 3, there is shown a block diagram of the presently preferred embodiment of the peak accelerated filter of the present invention. The summer 9 receives two input signals at input ports A and B and outputs a summed signal at output port C. The summation within the summer 9 includes multiplier constants k and q so the output at port C equals the constant k times the input at port A plus the constant q times the input at port B, or $$C = kA + qB \quad [1]$$

The constants of k and q are not critical to the scope of the present invention, but may be k=1 and q=5, for example. Input port A is coupled to the level detector output signal 5 represented in FIGS. 2a and 2b. Input port B is coupled to the output of the high pass filter 8.

The input of high pass filter 8 is also coupled to the level detector output 5 to receive the detector output signal. The function of the high pass filter 8 is to pass through the faster changing parts of the level detector output signal 5 and reject the slower changing parts. In the presently preferred embodiment, the high pass filter 8 is in the form of a first order high pass response but it may be realized in any high pass form including second or higher order filters and still remain within the scope of the present invention.

Figure 4:
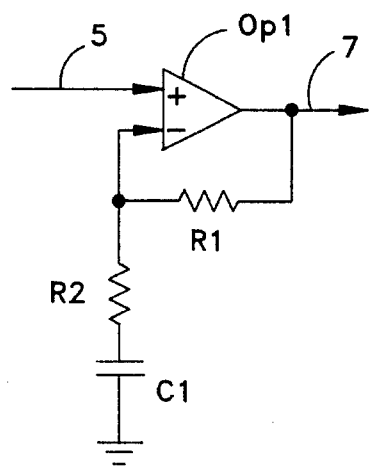
FIG. 4 is a detailed circuitry diagram of the preferred embodiment of the accelerated filter of the present invention.

Referring to FIG. 4, there is shown a circuit schematic diagram of the presently preferred embodiment of the peak accelerated filter of FIG. 3. It is not obvious how the circuit of FIG. 4 reflects the block diagram of FIG. 3, but the following explanation will clarify the relationships. Op1 is an operational amplifier with an inverting and non-inverting input, and an output. The non-inverting input of Op1 is coupled to the detected output 5 of the level detector 4. The output of Op1 is coupled to the VCA gain control path 7. The function of the high pass filter 8 of FIG. 3 is accomplished by the rising gain characteristic of the amplifier circuit comprising Op1, R1, R2, and C1. The amplifier voltage gain can be approximated as $$Av = 1 + (R1/(Z+R2)) \quad [2]$$

where Z represents the impedance of C1 which varies with frequency. The impedance of C1 is expressed as $$Z = 1/(2\pi f) \quad [3]$$

For the slower changing parts of the level detector output signal 5, Z is relatively high making Av approximately equal to one. This is the equivalent of the constant k of FIG. 3 being equal to one. The higher frequencies present in the level detector output signal receive increasing gain as a function of frequency because the impedance of C1 is progressively lower with frequency.

This circuit creates a first order high pass response cornering on the frequency determined by the equation $$Fc = 1/(2\pi R1C1) \quad [4]$$

Resistor R2 serves to limit the gain available for the highest frequencies that may be present in the level detector output signal. This gain limit, determined as the ratio of R1 divided by R2, is the equivalent of the constant q of FIG. 3. Thus, by selecting the values of R1, R2, and C1, the constant q and the high pass corner frequency can be altered to suit any specific circuit implementation. It is noted that the circuit of FIG. 4 will always give the constant k=1.

Figure 5:
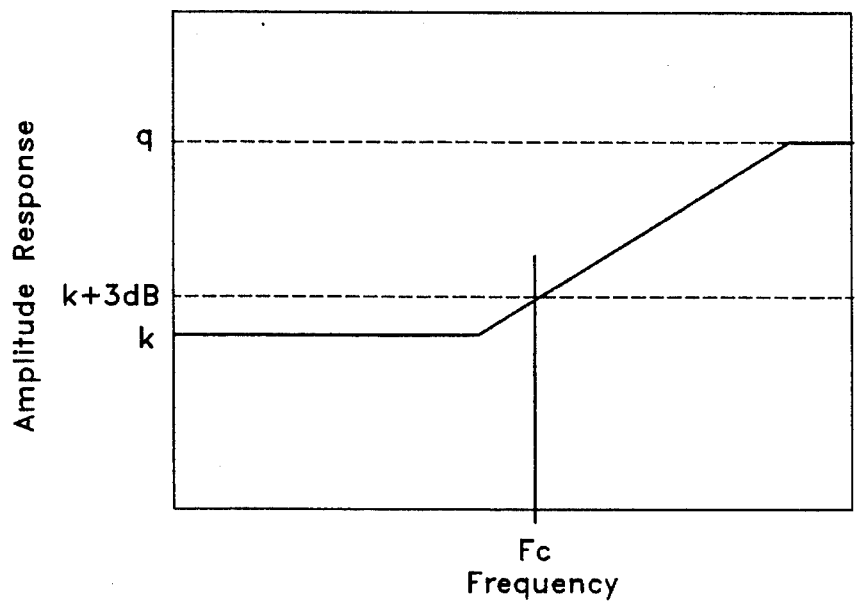
FIG. 5 is the normalized frequency response of the circuit of FIG. 4.

FIG. 5 illustrates a normalized illustrative plot (frequency response) of the circuit of FIG. 4. The vertical axis is amplitude and the horizontal axis is frequency. No particular values are attached to the coordinates.

Figure 6:
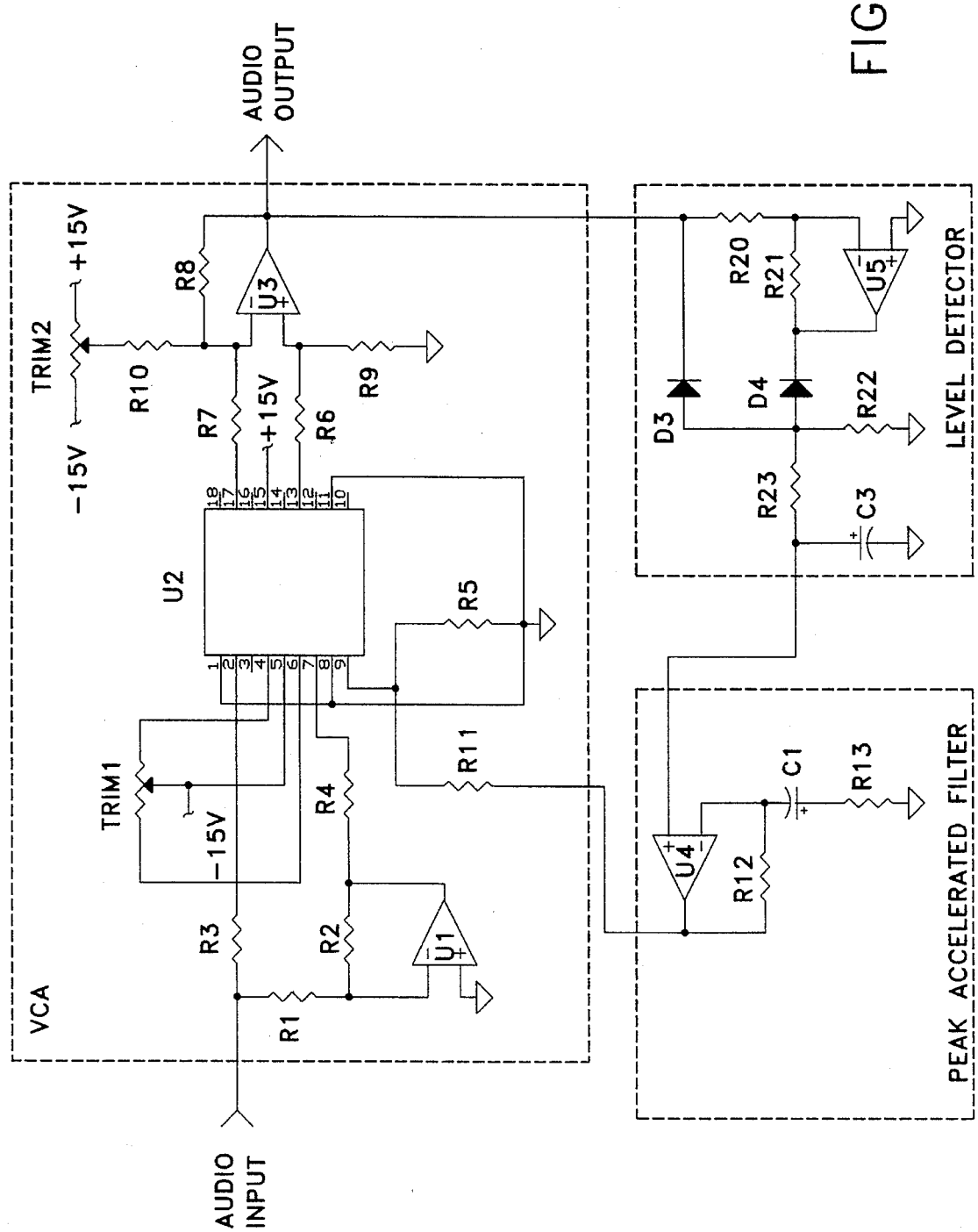
FIG. 6 is a circuit schematic diagram, for purposes of illustration only, showing one embodiment of the present invention using a rectifier type level detector.

Referring to FIG. 6, there is shown a circuit schematic diagram of one form of the present invention peak accelerated compressor. This circuit is merely one of many possible circuit arrangements which can serve to illustrate the workings of the present invention and does not limit the scope of the invention. The circuit of FIG. 6 corresponds to the block diagram of FIG. 2b as follows.

The VCA 2 of FIG. 2b is composed of U1 through U3, R1 through R10, Trim1, and Trim2. The integrated circuit U2 is a voltage controlled amplifier chip designated by part type VCA1001 available from Aphex Systems Ltd. of Sun Valley, Calif. U1 combined with R1 through R4 form a phase splitter to receive the audio input signal, as represented by 1 in FIG. 2b, and supply antiphased signals for the two inputs at pins 2 and 7 of U2. U3 combined with R6 through R10 serves as a differential amplifier to receive the two antiphased outputs from pins 13 and 17 of U2 and produce a VCA audio output signal corresponding to 3 of FIG. 2b. The VCA gain control input 7 of FIG. 2b is equivalent to the connection to R11 from U4. U4, R12, R13, and C1 form the peak accelerated filter 6 of FIG. 2b and correspond in an obvious manner with the peak accelerated filter of FIG. 4.

The level detector 4 of FIG. 2b corresponds to the level detector circuit of FIG. 6 comprised of U5, R20 through R23, D3, D4, and C3 which form a rectifier and a level detector. The connection of the C3+R23 node to the non-inverting input of U4 corresponds to the signal path 5 of FIG. 2b. The connection of the output of U3 to the D3+R20 node corresponds to the connection of the VCA output line 3 to the level detector input of FIG. 2b.

The operation of the circuit of FIG. 6 is as follows. An audio input signal is fed into the audio input of the VCA, and an audio output signal is produced by the VCA. The VCA audio output signal is coupled to the level detector which converts the audio signal into a full wave rectified and filtered detector output signal. The detector output signal is coupled to the input of the peak accelerated filter. The output of the peak accelerated filter is coupled to the VCA control input. The circuit just described forms a feedback type peak accelerated compressor of the present invention in the following manner. Audio signals at the output of the VCA create a varying direct current (D.C.) voltage at the output of the level detector.

The varying D.C. voltage contains the slower changing average value of the audio output signal as well as faster changing (higher frequency) ripples caused by the irregular peak values of the audio signal. The varying D.C. voltage from the level detector is processed by the peak accelerated filter whereby the slower changing average values of the D.C. voltage are not amplified greatly, but the faster changing values representing irregular peaks are more greatly amplified as a function of their relative rise time. The peak accelerated filter produces a D.C. control output to cause a reduction of the VCA gain. The VCA receives the said D.C. control signal and reacts accordingly, causing a greater relative gain reduction for transient audio input signals and a lesser relative gain reduction for average audio signals because of the effect of the peak accelerated filter.

Figure 7:
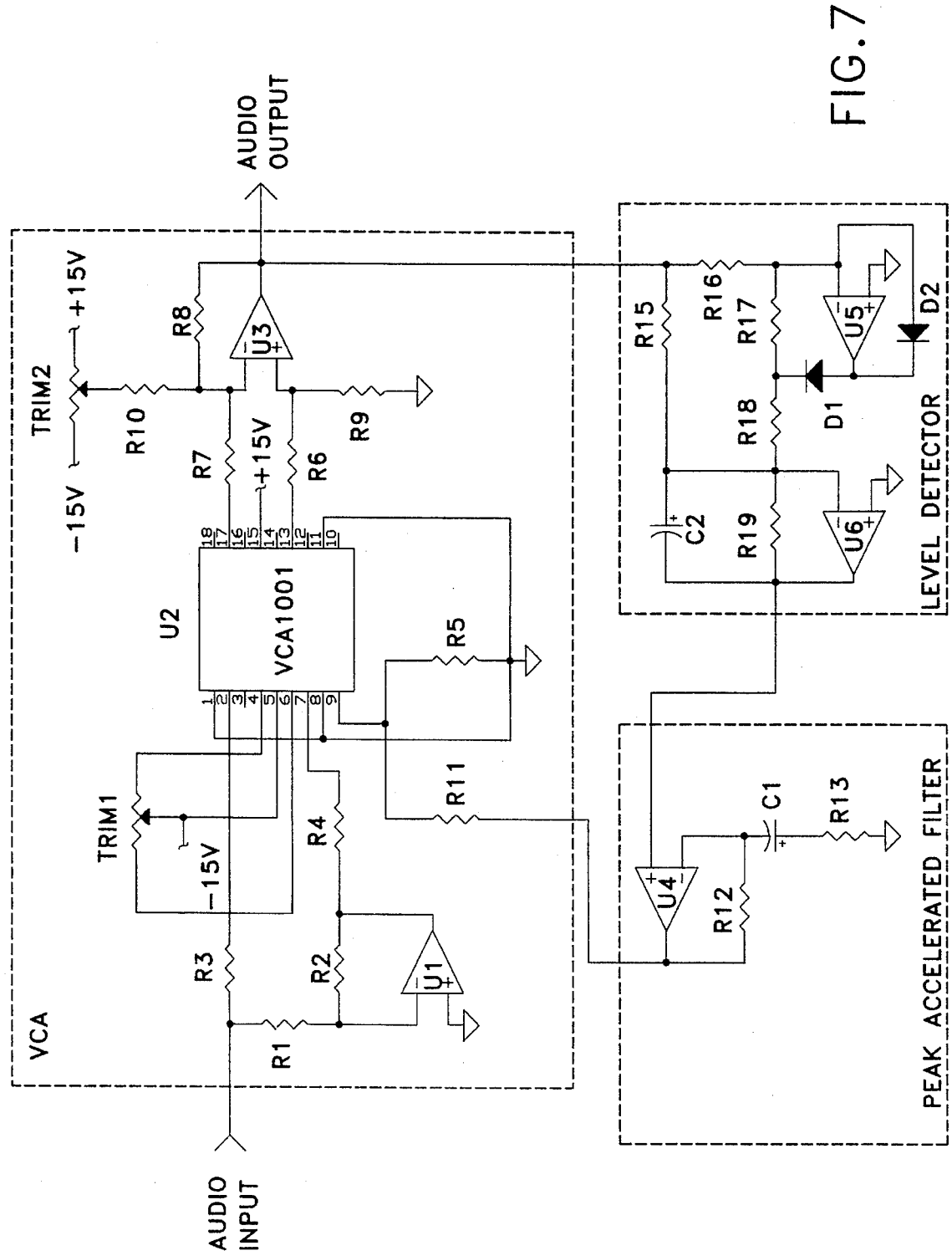
FIG. 7 is a circuit schematic diagram, for purposes of illustration only, showing another embodiment of the present invention using an absolute value type of level detector.

FIG. 7 describes a slight variation of the circuit of FIG. 6 for the purpose of showing that the present invention is not restricted to any specific level detector means. The circuit of FIG. 7 operates exactly the same as that of FIG. 6 except that the level detector comprises a conventional filtered absolute value converter as described in numerous textbooks and opamp data books. For example, the theory behind the level detector circuit of FIG. 7 is described in detail in the 1986 National Semiconductor Linear Applications Handbook, Ap Note LB-9, pages 1103 and 1104.

Figure 8A:
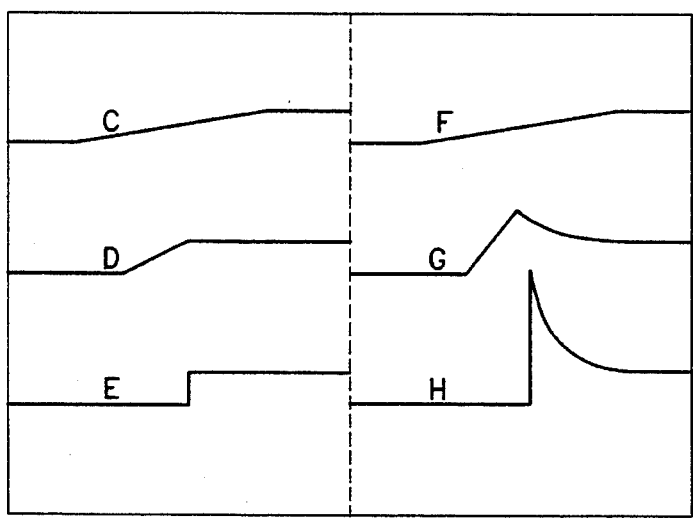
FIG. 8a illustrates how the rise time of a stepped input affects the peak accelerated filter output response.

FIG. 8a illustrates how the rise time of a stepped input affects the peak accelerated filter output response. Waveform C, D, and E represent inputs of different rise time to the peak accelerated filter. Waveforms F, G, and H represent the corresponding outputs of the peak accelerated filter. It can be seen that the faster the rise time of the input signal, the greater the amplitude of the corresponding output signal will become. This illustrates the peak accelerating effect of the present invention.

Figure 8B:
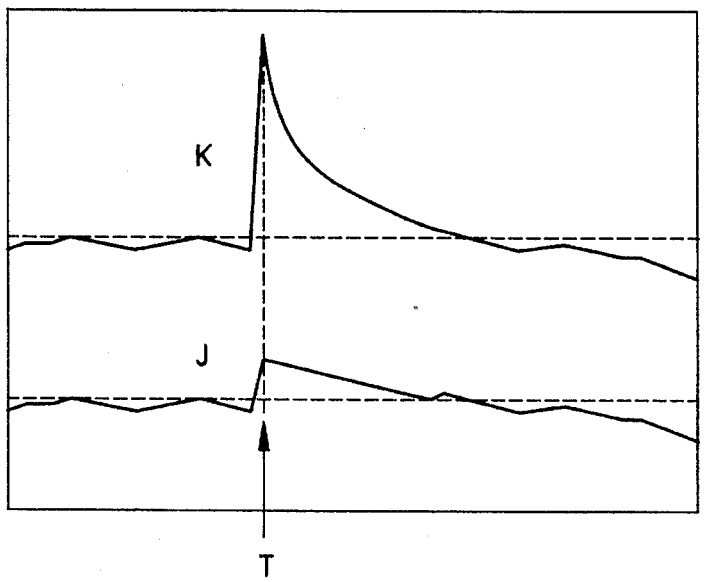
FIG. 8b shows the illustrative response of the peak accelerated filter of FIG. 4 to an input from the level detector.

FIG. 8b shows the anticipated response of the peak accelerated filter of FIG. 4 to an input from the level detector. Waveform J represents a typical level detector output as may be found at the signal path 5. Waveform K represents the output response of the peak accelerated filter at signal path 7. It can be seen that the peak accelerated filter increases the output level for the transient peak at time T but does not modify the smaller and slower changing parts of the waveform.

Figure 1A:
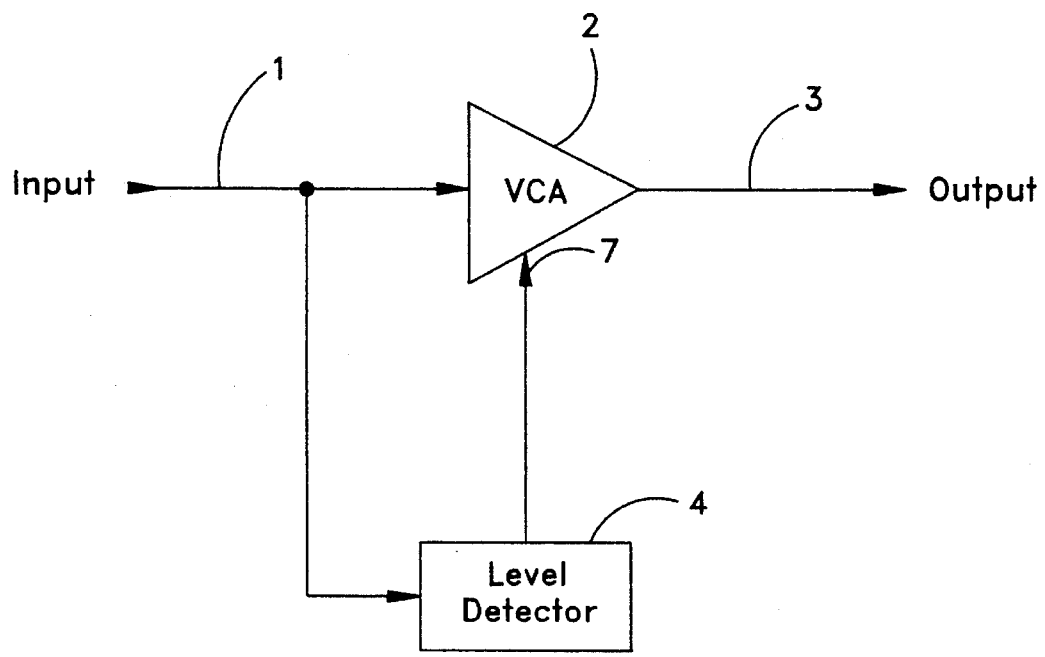
FIG. 1a is a block diagram of a basic feedforward compressor for illustration of prior art.
Figure 1B:
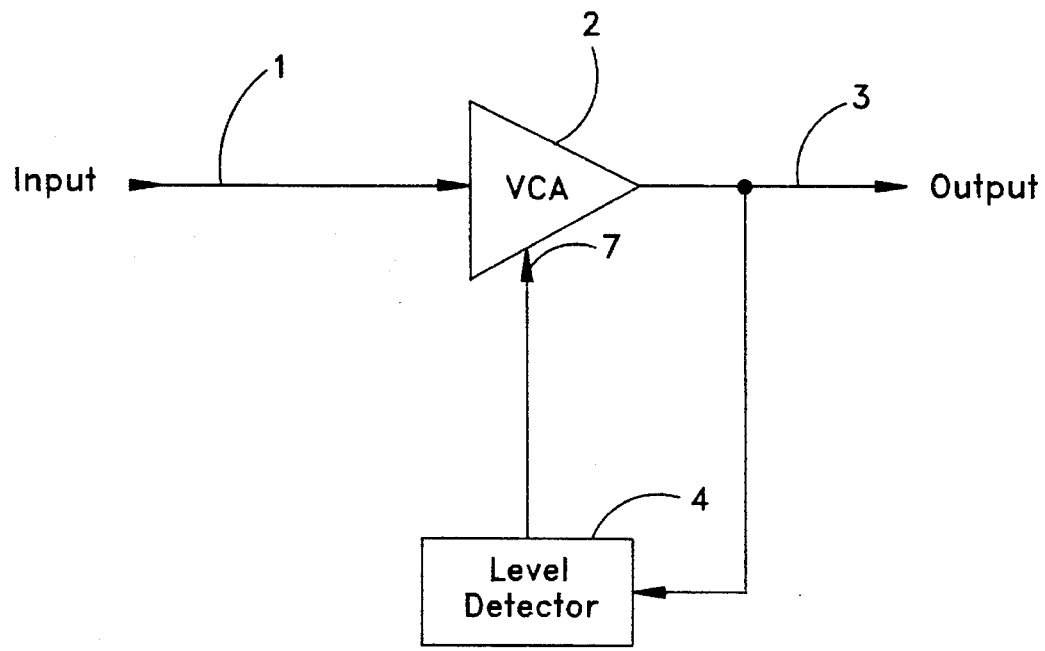
FIG. 1b is a block diagram of a basic feedback compressor for illustration of prior art.
Figure 9:
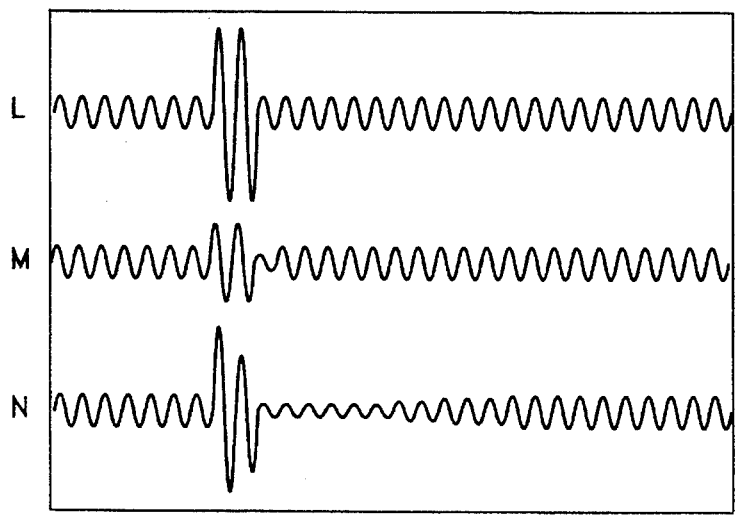
FIG. 9 illustrates the advantages of the present invention by comparing the compression response of the present invention peak accelerated compressor to a conventional compressor circuit such as shown in FIGS. 1a and 1b.

FIG. 9 illustrates the advantages of the present invention by comparing the compression response of the present invention peak accelerated compressor to a conventional compressor circuit such as shown in FIGS. 1a and 1b. Waveform L represents an audio input signal as may be found, for example, at the input signal path 1 of FIG. 2a or 2b. Waveform M represents the audio output signal, as may be found at the output signal path 3 of FIG. 2a or 2b, when the present invention peak accelerated compressor 6 is utilized. Waveform N represents the corresponding audio output signal of the conventional compressor. Note the peak accelerated compressor of the present invention reduces the transient peak of the input signal much more effectively.

Defined in detail, the present invention is a peak accelerated compressor, comprising: (a) a voltage controlled amplifier circuit coupled between an input signal path and an output signal path for receiving an input audio signal and producing an output audio signal; (b) the voltage controlled amplifier circuit including a phase splitter connected to the input path, a differential amplifier connected to the output path, and a voltage controlled amplifier connected between the phase splitter and the differential amplifier; (c) a level detector circuit coupled to a sample signal path for receiving a sample audio signal which contains transient peaks and average waveforms; (d) the level detector circuit including a rectifier for rectifying the sample audio signal, and a level detector for detecting the level of the sample audio signal; (e) the level detector circuit producing a detector output signal which is fast changing in response to the transient peaks in the sample audio signal, but slow changing in response to the average waveforms in the sample audio signal; (f) a peak accelerated filter circuit coupled between the level detector circuit and the voltage controlled amplifier circuit for receiving the detector output signal; (g) the peak accelerated filter circuit including an operational amplifier and a resistor-capacitor network, the operational amplifier having a non-inverting input for receiving the detector output signal from the level detector circuit, an inverting input, and an output for delivering a control signal to the voltage controlled amplifier circuit, and the resistor-capacitor network connected between the output and the inverting input of the operational amplifier for serving as a high pass filter; (h) the peak accelerated filter circuit producing a control output signal to reduce the gain of the voltage controlled amplifier circuit when the detector output signal is fast changing in response to the transient peaks in the sample audio signal, but maintain the gain of the voltage controlled amplifier circuit when the detector output signal is slow changing in response to the average waveforms in the sample audio signal; and (i) the peak accelerated filter circuit causing a greater relative gain reduction in the voltage controlled amplifier circuit for the transient peaks but a less relative gain reduction for the average waveforms; (j) whereby the peak accelerated compressor effectively enhances the compression for transient peaks without adversely affecting the normal compression of average waveforms.

Defined broadly, the present invention is a peak accelerated compressor, comprising: (a) a voltage controlled amplifier circuit for processing an input audio signal and producing an output audio signal; (b) a level detector circuit for processing a sample audio signal which contains transient peaks and average waveforms and producing a detector output signal which is fast changing in response to the transient peaks in the sample audio signal, but slow changing in response to the average waveforms in the sample audio signal; (c) a peak accelerated filter circuit coupled between the level detector circuit and the voltage controlled amplifier circuit for processing the detector output signal; (d) the peak accelerated filter circuit including a summing device for combining a first signal which is the detector output signal and a second signal which is the detector output signal filtered by a high pass filter and enhanced by a factor greater than one; (e) the peak accelerated filter circuit producing a control output signal to reduce the gain of the voltage controlled amplifier circuit when the detector output signal is fast changing in response to the transient peaks in the sample audio signal, but maintain the gain of the voltage controlled amplifier circuit when the detector output signal is slow changing in response to the average waveforms in the sample audio signal; and (f) the peak accelerated filter circuit causing a greater relative gain reduction in the voltage controlled amplifier circuit for the transient peaks but a less relative gain reduction for the average waveforms; (g) whereby the peak accelerated compressor effectively enhances the compression for transient peaks without adversely affecting the normal compression of average waveforms.

Defined more broadly, the present invention is a peak accelerated compressor, comprising: (a) a voltage controlled amplifier circuit for processing an input audio signal and producing an output audio signal; (b) a level detector circuit for processing a sample audio signal which contains transient peaks and average waveforms; and (c) peak accelerated filter circuit coupled between the level detector circuit and the voltage controlled amplifier circuit to impose peak accelerated gain to the voltage controlled amplifier circuit in response to the transient peaks in the sample audio signal;

(d) whereby the peak accelerated compressor effectively enhances the compression for transient peaks without adversely affecting the normal compression of average waveforms.

Defined even more broadly, the present invention is an apparatus for use with a compressor which includes a voltage controlled amplifier and a level detector for processing an electronic signal which contains transient peaks and average waveforms, the apparatus comprising a peak accelerated filter coupled between the level detector and the voltage controlled amplifier and having means for imposing peak accelerated gain to the voltage controlled amplifier in response to the transient peaks in the electronic signal, to effectively enhance the compression for transient peaks without adversely affecting the normal compression of average waveforms.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A peak accelerated compressor, comprising:
   a. a voltage controlled amplifier circuit coupled between an input signal path and an output signal path for receiving an input audio signal and producing an output audio signal;
   b. said voltage controlled amplifier circuit including a phase splitter connected to said input path, a differential amplifier connected to said output path, and a voltage controlled amplifier connected between the phase splitter and the differential amplifier;
   c. a level detector circuit coupled to a sample signal path for receiving a sample audio signal which contains transient peaks and average waveforms;
   d. said level detector circuit including a rectifier for rectifying said sample audio signal, and a level detector for detecting the level of said sample audio signal;
   e. said level detector circuit producing a detector output signal which is fast changing in response to said transient peaks in said sample audio signal, but slow changing in response to said average waveforms in said sample audio signal;
   f. a peak accelerated filter circuit coupled between said level detector circuit and said voltage controlled amplifier circuit for receiving said detector output signal;
   g. said peak accelerated filter circuit including an operational amplifier and a resistor-capacitor network, the operational amplifier having a non-inverting input for receiving said detector output signal from said level detector circuit, an inverting input, and an output for delivering a control signal to said voltage controlled amplifier circuit, and the resistor-capacitor network connected between the output and the inverting input of the operational amplifier for serving as a high pass filter;
   h. said peak accelerated filter circuit producing a control output signal to reduce the gain of said voltage controlled amplifier circuit when said detector output signal is fast changing in response to the transient peaks in the sample audio signal, but maintain the gain of said voltage controlled amplifier circuit when the detector output signal is slow changing in response to the average waveforms in the sample audio signal; and
   i. said peak accelerated filter circuit causing a greater relative gain reduction in said voltage controlled amplifier circuit for said transient peaks but a less relative gain reduction for said average waveforms;
   j. whereby the peak accelerated compressor effectively enhances the compression for transient peaks without adversely affecting the normal compression of average waveforms.

2. The peak accelerated compressor as defined in claim 1 wherein said sample audio signal path is connected to said input signal path which makes said peak accelerated compressor a feedforward peak accelerated compressor.

3. The peak accelerated compressor as defined in claim 1 wherein said sample audio signal path is connected to said output signal path which makes said peak accelerated compressor a feedback peak accelerated compressor.

4. The peak accelerated compressor as defined in claim 1 wherein said resistor-capacitor network includes a first resistor connected between said output and said inverting input of said operational amplifier, and a capacitor and a second resistor connected in series between said inverting input of said operational amplifier and an electrical ground.

5. A peak accelerated compressor, comprising:
   a. a voltage controlled amplifier circuit for processing an input audio signal and producing an output audio signal;
   b. a level detector circuit for processing a sample audio signal which contains transient peaks and average waveforms and producing a detector output signal which is fast changing in response to the transient peaks in the sample audio signal, but slow changing in response to the average waveforms in the sample audio signal;
   c. a peak accelerated filter circuit coupled between said level detector circuit and said voltage controlled amplifier circuit for processing said detector output signal;
   d. said peak accelerated filter circuit including a summing device for combining a first signal which is said detector output signal and a second signal which is said detector output signal filtered by a high pass filter and enhanced by a factor greater than one;
   e. said peak accelerated filter circuit producing a control output signal to reduce the gain of said voltage controlled amplifier circuit when said detector output signal is fast changing in response to the transient peaks in the sample audio signal, but maintain the gain of said voltage controlled amplifier circuit when the detector output signal is slow changing in response to the average waveforms in the sample audio signal; and
   f. said peak accelerated filter circuit causing a greater relative gain reduction in said voltage controlled amplifier circuit for said transient peaks but a less relative gain reduction for said average waveforms;
   g. whereby the peak accelerated compressor effectively enhances the compression for transient peaks without adversely affecting the normal compression of average waveforms.

6. The peak accelerated compressor as defined in claim 5 wherein said sample audio signal is collected from said input signal which makes said peak accelerated compressor a feedforward peak accelerated compressor.

7. The peak accelerated compressor as defined in claim 5 wherein said sample audio signal is collected from said output signal which makes said peak accelerated compressor a feedback peak accelerated compressor.

8. The peak accelerated compressor as defined in claim 5 wherein said voltage controlled amplifier circuit comprises a phase splitter which receives said input audio signal, a differential amplifier which delivers said output audio signal, and a voltage controlled amplifier connected between the phase splitter and the differential amplifier.

9. The peak accelerated compressor as defined in claim 5 wherein said factor greater than one equals to five (5).

10. The peak accelerated compressor as defined in claim 5 wherein said level detector circuit comprises a rectifier for rectifying said sample audio signal, and a level detector for detecting the level of said sample audio signal.

11. The peak accelerated compressor as defined in claim 5 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

12. The peak accelerated compressor as defined in claim 11 wherein said high pass filter of said peak accelerated filter circuit comprises a resistor-capacitor network connected between said output and said inverting input of said operational amplifier.

13. The peak accelerated compressor as defined in claim 12 wherein said resistor-capacitor network includes a first resistor connected between said output and said inverting input of said operational amplifier, and a capacitor and a second resistor connected in series between said inverting input of said operational amplifier and an electrical ground.

14. A peak accelerated compressor, comprising:
 a. a voltage controlled amplifier circuit for processing an input audio signal and producing an output audio signal;
 b. a level detector circuit for processing a sample audio signal which contains transient peaks and average waveforms having different rate of change; and
 c. a peak accelerated filter circuit coupled between said level detector circuit and said voltage controlled amplifier circuit to differentiate said transient peaks and said average waveforms based on their rate of change, and impose peak accelerated gain to said level detector in response to said transient peaks in the audio signal thus increasing the compression ratio for said transient peaks;
 d. whereby the peak accelerated compressor effectively enhances the compression for transient peaks without adversely affecting the normal compression of average waveforms.

15. The peak accelerated compressor as defined in claim 14 wherein said sample audio signal is collected from said input signal which makes said peak accelerated compressor a feedforward peak accelerated compressor.

16. The peak accelerated compressor as defined in claim 14 wherein said sample audio signal is collected from said output signal which makes said peak accelerated compressor a feedback peak accelerated compressor.

17. The peak accelerated compressor as defined in claim 14 wherein said voltage controlled amplifier circuit comprises a phase splitter which receives said input audio signal, a differential amplifier which delivers said output audio signal, and a voltage controlled amplifier connected between the phase splitter and the differential amplifier.

18. The peak accelerated compressor as defined in claim 14 wherein said level detector circuit comprises a rectifier for rectifying said sample audio signal, and a level detector for detecting the level of said sample audio signal and producing a detector output signal.

19. The peak accelerated compressor as defined in claim 18 wherein said peak accelerated filter circuit comprises a summing device for combining a first signal which is said detector output signal and a second signal which is said detector output signal filtered by a high pass filter and enhanced by a factor greater than one.

20. The peak accelerated compressor as defined in claim 19 wherein said factor greater than one equals to five (5).

21. The peak accelerated compressor as defined in claim 19 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

22. The peak accelerated compressor as defined in claim 21 wherein said high pass filter of said peak accelerated filter circuit comprises a resistor-capacitor network connected between said output and said inverting input of said operational amplifier.

23. The peak accelerated compressor as defined in claim 22 wherein said resistor-capacitor network includes a first resistor connected between said output and said inverting input of said operational amplifier, and a capacitor and a second resistor connected in series between said inverting input of said operational amplifier and an electrical ground.

24. An apparatus for use with a compressor which includes a voltage controlled amplifier and a level detector for processing an electronic signal which contains transient peaks and average waveforms having different rate of change, the apparatus comprising a peak accelerated filter coupled between the level detector and the voltage controlled amplifier and having means for differentiating said transient peaks and said average waveforms based on their rate of change, and imposing peak accelerated gain to the voltage controlled amplifier in response to the transient peaks in the electronic signal, to effectively enhance the compression for transient peaks without adversely affecting the normal compression of average waveforms.

25. The apparatus as defined in claim 24 wherein said level detector collects signal from input signals of said compressor which makes said compressor a feedforward compressor.

26. The apparatus as defined in claim 24 wherein said level detector collects signal from output signals of said compressor which makes said compressor a feedforward compressor.

27. The apparatus as defined in claim 24 wherein said peak accelerated filter comprises a summing device for combining a first signal which is a detector output signal produced by said level detector and a second signal which is the detector output signal filtered by a high pass filter and enhanced by a factor greater than one.

28. The apparatus as defined in claim 27 wherein said factor greater than one equals to five (5).

29. The apparatus as defined in claim 27 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

30. The apparatus as defined in claim 29 wherein said high pass filter of said peak accelerated filter circuit comprises a resistor-capacitor network connected between said output and said inverting input of said operational amplifier.

31. A peak accelerated compressor, comprising:
   a. a voltage controlled amplifier circuit for processing an input audio signal and producing an output audio signal, including a phase splitter which receives said input audio signal, a differential amplifier which delivers said output audio signal, and a voltage controlled amplifier connected between the phase splitter and the differential amplifier;
   b. a level detector circuit for processing a sample audio signal which contains transient peaks and average waveforms; and
   c. a peak accelerated filter circuit coupled between said level detector circuit and said voltage controlled amplifier circuit to impose peak accelerated gain to said level detector in response to said transient peaks in the audio signal thus increasing the compression ratio for said transient peaks;
   d. whereby the peak accelerated compressor effectively enhances the compression for transient peaks without adversely affecting the normal compression of average waveforms.

32. The peak accelerated compressor as defined in claim 31 wherein said sample audio signal is collected from said input signal which makes said peak accelerated compressor a feedforward peak accelerated compressor.

33. The peak accelerated compressor as defined in claim 31 wherein said sample audio signal is collected from said output signal which makes said peak accelerated compressor a feedback peak accelerated compressor.

34. The peak accelerated compressor as defined in claim 31 wherein said level detector circuit comprises a rectifier for rectifying said sample audio signal, and a level detector for detecting the level of said sample audio signal and producing a detector output signal.

35. The peak accelerated compressor as defined in claim 34 wherein said peak accelerated filter circuit comprises a summing device for combining a first signal which is said detector output signal and a second signal which is said detector output signal filtered by a high pass filter and enhanced by a factor greater than one.

36. The peak accelerated compressor as defined in claim 35 wherein said factor greater than one equals to five (5).

37. The peak accelerated compressor as defined in claim 35 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

38. The peak accelerated compressor as defined in claim 37 wherein said high pass filter of said peak accelerated filter circuit comprises a resistor-capacitor network connected between said output and said inverting input of said operational amplifier.

39. The peak accelerated compressor as defined in claim 38 wherein said resistor-capacitor network includes a first resistor connected between said output and said inverting input of said operational amplifier, and a capacitor and a second resistor connected in series between said inverting input of said operational amplifier and an electrical ground.

40. A peak accelerated compressor, comprising:
   a. a voltage controlled amplifier circuit for processing an input audio signal and producing an output audio signal;
   b. a level detector circuit for processing a sample audio signal which contains transient peaks and average waveforms, including a rectifier for rectifying said sample audio signal, and a level detector for detecting the level of said sample audio signal and producing a detector output signal;
   c. a peak accelerated filter circuit coupled between said level detector circuit and said voltage controlled amplifier circuit to impose peak accelerated gain to said level detector in response to said transient peaks in the audio signal thus increasing the compression ratio for said transient peaks; and
   d. said peak accelerated filter circuit including a summing device for combining a first signal which is said detector output signal and a second signal which is said detector output signal filtered by a high pass filter and enhanced by a factor greater than one;
   e. whereby the peak accelerated compressor effectively enhances the compression for transient peaks without adversely affecting the normal compression of average waveforms.

41. The peak accelerated compressor as defined in claim 40 wherein said sample audio signal is collected from said input signal which makes said peak accelerated compressor a feedforward peak accelerated compressor.

42. The peak accelerated compressor as defined in claim 40 wherein said sample audio signal is collected from said output signal which makes said peak accelerated compressor a feedback peak accelerated compressor.

43. The peak accelerated compressor as defined in claim 40 wherein said voltage controlled amplifier circuit comprises a phase splitter which receives said input audio signal, a differential amplifier which delivers said output audio signal, and a voltage controlled amplifier connected between the phase splitter and the differential amplifier.

44. The peak accelerated compressor as defined in claim 40 wherein said factor greater than one equals to five (5).

45. The peak accelerated compressor as defined in claim 40 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

46. The peak accelerated compressor as defined in claim 45 wherein said high pass filter of said peak accelerated filter circuit comprises a resistor-capacitor network connected between said output and said inverting input of said operational amplifier.

47. The peak accelerated compressor as defined in claim 46 wherein said resistor-capacitor network includes a first resistor connected between said output and said inverting input of said operational amplifier, and a capacitor and a second resistor connected in series between said inverting input of said operational amplifier and an electrical ground.

48. A peak accelerated compressor, comprising:
   a. a voltage controlled amplifier circuit for processing an input audio signal and producing an output audio signal;

b. a level detector circuit for processing a sample audio signal which contains transient peaks and average waveforms;

c. a peak accelerated filter circuit coupled between said level detector circuit and said voltage controlled amplifier circuit to impose peak accelerated gain to said level detector in response to said transient peaks in the audio signal thus increasing the compression ratio for said transient peaks; and d. said peak accelerated filter circuit including a summing device for combining a first signal which is said detector output signal and a second signal which is said detector output signal filtered by a high pass filter and enhanced by a factor greater than one;

e. whereby the peak accelerated compressor effectively enhances the compression for transient peaks without adversely affecting the normal compression of average waveforms.

49. The peak accelerated compressor as defined in claim 48 wherein said sample audio signal is collected from said input signal which makes said peak accelerated compressor a feedforward peak accelerated compressor.

50. The peak accelerated compressor as defined in claim 48 wherein said sample audio signal is collected from said output signal which makes said peak accelerated compressor a feedback peak accelerated compressor.

51. The peak accelerated compressor as defined in claim 48 wherein said voltage controlled amplifier circuit comprises a phase splitter which receives said input audio signal, a differential amplifier which delivers said output audio signal, and a voltage controlled amplifier connected between the phase splitter and the differential amplifier.

52. The peak accelerated compressor as defined in claim 48 wherein said level detector circuit comprises a rectifier for rectifying said sample audio signal, and a level detector for detecting the level of said sample audio signal and producing a detector output signal.

53. The peak accelerated compressor as defined in claim 48 wherein said factor greater than one equals to five (5).

54. The peak accelerated compressor as defined in claim 48 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

55. The peak accelerated compressor as defined in claim 54 wherein said high pass filter of said peak accelerated filter circuit comprises a resistor-capacitor network connected between said output and said inverting input of said operational amplifier.

56. The peak accelerated compressor as defined in claim 55 wherein said resistor-capacitor network includes a first resistor connected between said output and said inverting input of said operational amplifier, and a capacitor and a second resistor connected in series between said inverting input of said operational amplifier and an electrical ground.

57. An apparatus for use with a compressor which includes a voltage controlled amplifier and a level detector for processing an electronic signal which contains transient peaks and average waveforms, the apparatus comprising a peak accelerated filter coupled between the level detector and the voltage controlled amplifier and having means for imposing peak accelerated gain to the voltage controlled amplifier in response to the transient peaks in the electronic signal, to effectively enhance the compression for transient peaks without adversely affecting the normal compression of average waveforms, where said peak accelerated filter includes a summing device for combining a first signal which is a detector output signal produced by said level detector and a second signal which is the detector output signal filtered by a high pass filter and enhanced by a factor greater than one.

58. The apparatus as defined in claim 57 wherein said level detector collects signal from input signals of said compressor which makes said compressor a feedforward compressor.

59. The apparatus as defined in claim 57 wherein said level detector collects signal from output signals of said compressor which makes said compressor a feedforward compressor.

60. The apparatus as defined in claim 57 wherein said factor greater than one equals to five (5).

61. The apparatus as defined in claim 57 wherein said summing device of said peak accelerated filter circuit comprises an operational amplifier which has a non-inverting input for receiving said detector output signal from said level detector circuit, an inverting input, and an output for delivering a control signal to said voltage controlled amplifier circuit.

62. The apparatus as defined in claim 61 wherein said high pass filter of said peak accelerated filter circuit comprises a resistor-capacitor network connected between said output and said inverting input of said operational amplifier.

* * * * *